United States Patent [19]
Wada

[11] Patent Number: 6,008,136
[45] Date of Patent: Dec. 28, 1999

[54] METHOD FOR MANUFACTURING SEMICONDUCTOR DEVICE CAPABLE OF IMPROVING ETCHING RATE RATIO OF INSULATOR TO REFRACTORY METAL

[75] Inventor: Shigeki Wada, Tokyo, Japan

[73] Assignee: NEC Corporation, Tokyo, Japan

[21] Appl. No.: 08/987,597

[22] Filed: Dec. 9, 1997

[30] Foreign Application Priority Data

Dec. 11, 1996 [JP] Japan ................................... 8-330830

[51] Int. Cl.⁶ .................................................. H01L 21/302
[52] U.S. Cl. .......................... 438/723; 438/724; 438/743; 438/744; 438/637; 438/638; 438/639; 438/640; 438/672; 438/675
[58] Field of Search ................................... 438/723, 724, 438/743, 744, 637, 638, 639, 640, 672, 675; 216/17, 18

[56] References Cited

U.S. PATENT DOCUMENTS

| | | | |
|---|---|---|---|
| 4,522,681 | 6/1985 | Gorowitz et al. | 156/643 |
| 4,582,563 | 4/1986 | Hazuki et al. | 156/643 |
| 5,702,982 | 12/1997 | Lee et al. | 437/195 |

FOREIGN PATENT DOCUMENTS

| | | | |
|---|---|---|---|
| 62-150889 | 7/1987 | Japan | H01L 29/80 |
| 64-24466 | 1/1989 | Japan | H01L 29/80 |
| 2-280326 | 11/1990 | Japan | H01L 21/302 |
| 4-291925 | 10/1992 | Japan | H01L 21/331 |
| 6-112229 | 4/1994 | Japan | H01L 21/338 |

*Primary Examiner*—John F. Niebling
*Assistant Examiner*—David A Zarneke
*Attorney, Agent, or Firm*—Hayes Soloway Hennessey Grossman & Hage PC

[57] ABSTRACT

In a method for manufacturing a semiconductor device, an insulating layer is formed on a refractory metal layer, and a contact hole in the insulating layer by a dry etching process using an etching gas includes one of:

a mixture gas of fluorocarbon and hydrogen;

a mixture gas of hydrofluorocarbon and hydrogen;

a gas of hydrofluorocarbon; and a fluorocarbon gas except for $CF_4$.

5 Claims, 21 Drawing Sheets

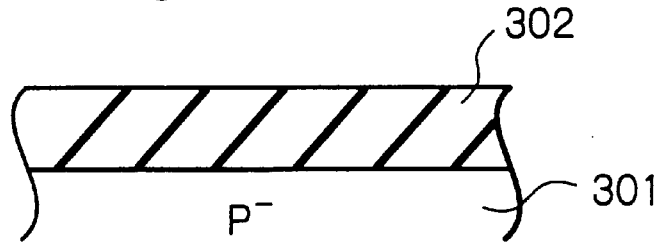
Fig. 3A PRIOR ART
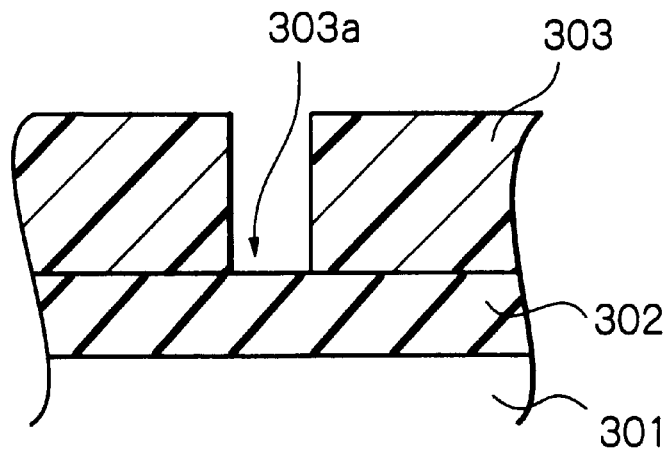
Fig. 3B PRIOR ART
Fig. 3C PRIOR ART
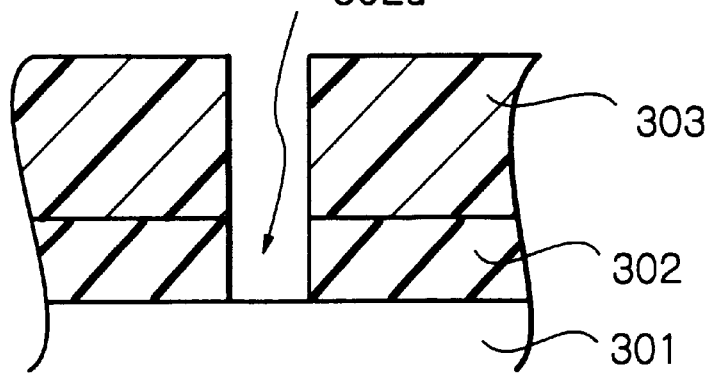

$CF_4 + H_2$  $CF_4 + H_2$  $CF_4 + H_2$

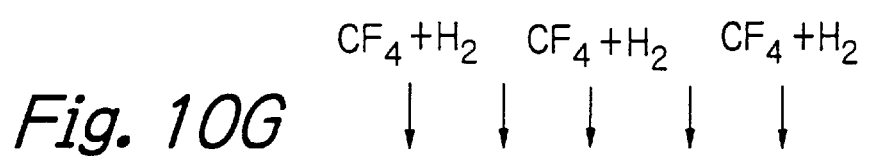
Fig. 10G
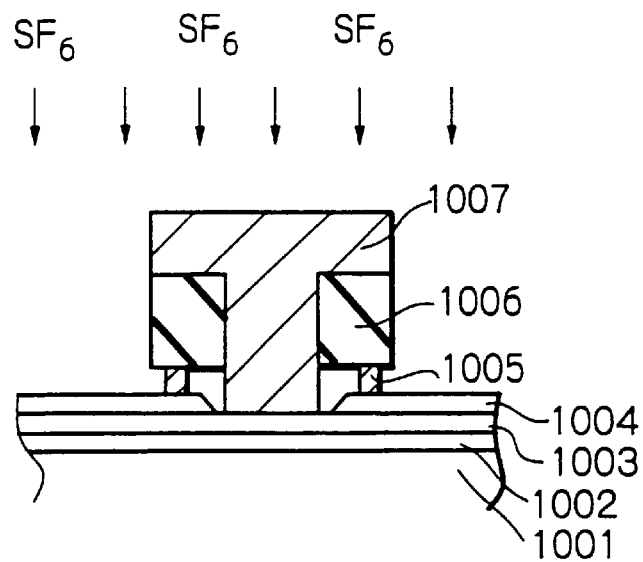
Fig. 10H
Fig. 10I
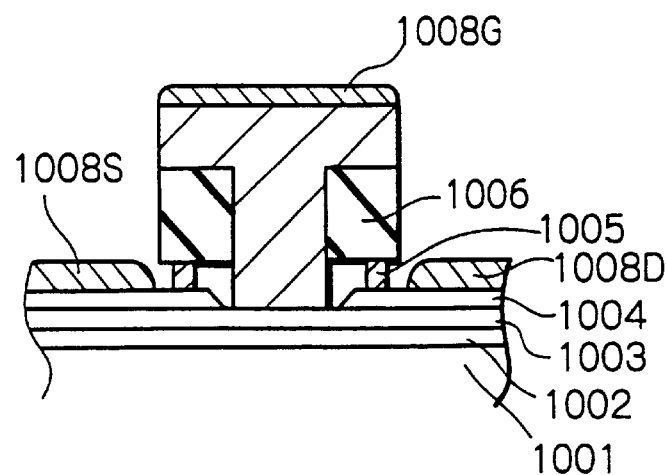

METHOD FOR MANUFACTURING SEMICONDUCTOR DEVICE CAPABLE OF IMPROVING ETCHING RATE RATIO OF INSULATOR TO REFRACTORY METAL

BACKGROUND OF THE INVENTION

1. Field of the Invention

The present invention relates to a method for manufacturing a semiconductor device where a contact hole is perforated in an insulating layer formed on a refractory metal layer.

2. Description of the Related Art

In a prior art method for manufacturing a semiconductor device, an insulating layer is formed on a refractory metal layer, and a contact hole is perforated in the insulating layer by a dry etching process using $CF_4$ gas. This will be explained later in detail.

In the prior art method, however, the etching rate ratio of the insulating layer to the refractory metal layer by the dry etching process using $CF_4$ gas is not sufficiently large. Therefore, the refractory metal layer is overetched. As a result, an electrode or a connection layer deposited on the refractory metal layer is easily separated therefrom, which increases a contact resistance therebetween.

In addition, if the power of the dry etching process is increased to increase the above-mentioned etching ratio, the throughput is decreased.

On the other hand, assume that an insulating layer is formed on active regions of a semiconductor substrate. In this case, when the insulating layer is overetched, the active regions of the semiconductor substrate are exposed to $CF_3+$ ions which causes damage thereof.

SUMMARY OF THE INVENTION

It is an object of the present invention to provide a dry etching process exhibiting a high etching ratio of an insulating layer to an refractory metal layer in a method for manufacturing a semiconductor devices According to the present invention, in a method for manufacturing a semiconductor device, an insulating layer is formed on a refractory metal layer, and a contact hole is perforated in the insulating layer by a dry etching process using an etching gas. The etching gas includes one of:

a mixture gas of fluorocarbon and hydrogen;

a mixture gas of hydrofluorocarbon and hydrogen;

a gas of hydrofluorocarbon; and a fluorocarbon gas except for $CF_4$.

The refractory metal layer is preferably made of tungsten, tungsten alloy, molybdenum or molybdenum alloy. Such tungsten alloy is titanium tungsten, tungsten silicide, tungsten nitride or the like, and such molybdenum alloy is molybdenum nitride, molybdenum titanium or the like. Also, the refractory metal layer can be made of two or more layers.

The insulating layer is preferably made of silicon oxide, silicon nitride or silicon oxide nitride.

The fluorocarbon gas is aliphatic hydrocarbon gas where hydrogen is replaced by fluorine, such as $CF_4$ gas, $C_2F_6$ gas or $C_3F_8$ gas. The flow rate ratio of $H_2$ gas to fluorocarbon gas plus $H_2$ gas is about 10 to 50 percent, and preferably, 30 to 40 percent.

The hydrofluorocarbon gas is aliphatic hydrocarbon gas where hydrogen is replaced by a part of fluorine, such as $CHF_3$ gas, $CH_2F_2$ gas or $C_2HF_5$ gas.

The fluorocarbon gas except for $CH_4$ is preferably $C_3H_8$ gas.

BRIEF DESCRIPTION OF THE DRAWINGS

The present invention swill be more clearly understood from the description as set forth below, in comparison with the prior art, with reference to the accompanying drawings, wherein:

FIGS. 3A through 3C are cross-sectional views for explaining a second prior art method for manufacturing a semiconductor device;

FIGS. 10A through 10I are cross-sectional views for explaining a third embodiment of the method for manufacturing a semiconductor device according to the present invention;

DESCRIPTION OF THE PREFERRED EMBODIMENTS

Before the description of the preferred embodiments, prior art methods for manufacturing a semiconductor device will be explained with reference to FIGS. 1A through 1D, 2, 3A through 3C and 4.

FIGS. 1A through 1D are cross-sectional views for explaining a first prior art method for manufacturing a semiconductor device.

Figure 1A:
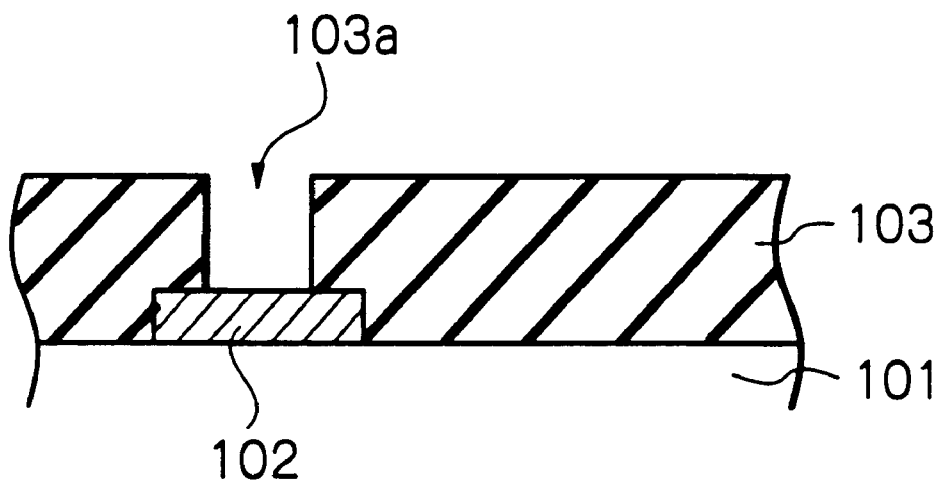
FIGS. 1A through 1D are cross-sectional views for explaining a first prior art method for manufacturing a semiconductor device.

First, referring to FIG. 1A, a conductive layer 102 is deposited on a semiconductor substrate 101. Then, an about 0.8 $\mu$m thick silicon oxide layer 103 is formed on the entire surface by a chemical vapor deposition (CVD) process, and a contact hole 103a is perforated in the silicon oxide layer 103 by a photolithography and etching process.

Figure 1B:
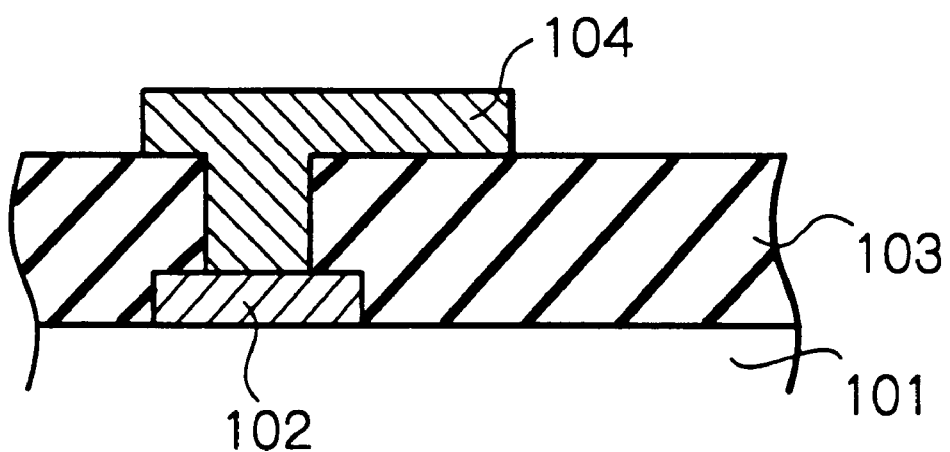

Next, referring to FIG. 1B, an about 0.3 $\mu$m thick tungsten (W) layer 104 is deposited and is patterned by a photolithography and etching process.

Figure 1C:
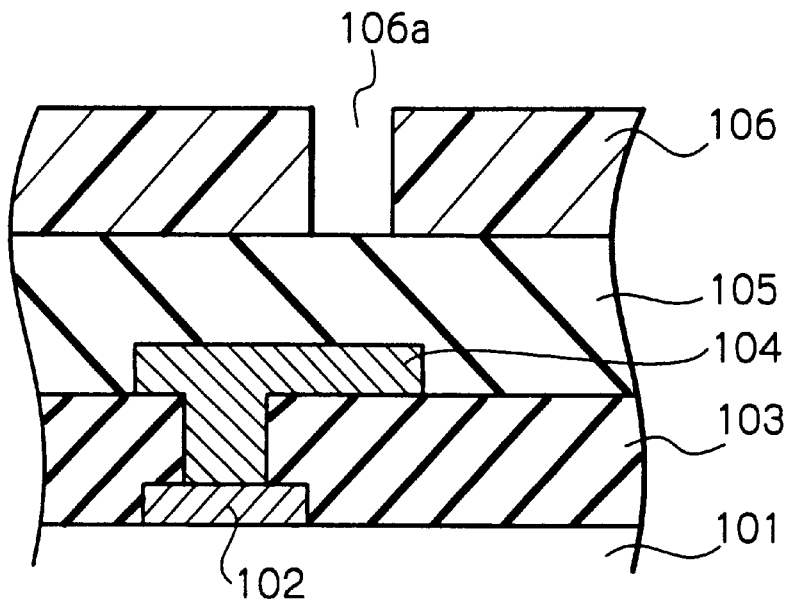

Next, referring to FIG. 1C, an about 1.5 $\mu$m thick SiON layer 105 is deposited on the entire surface by a plasma CVD process, and an etching back process is performed thereupon to flatten the SiON layer 105 which is, in this case, about 1.0 μm thick. Then, a photoresist pattern 106 having an opening 106a is coated on the SiON layer 105.

Figure 1D:
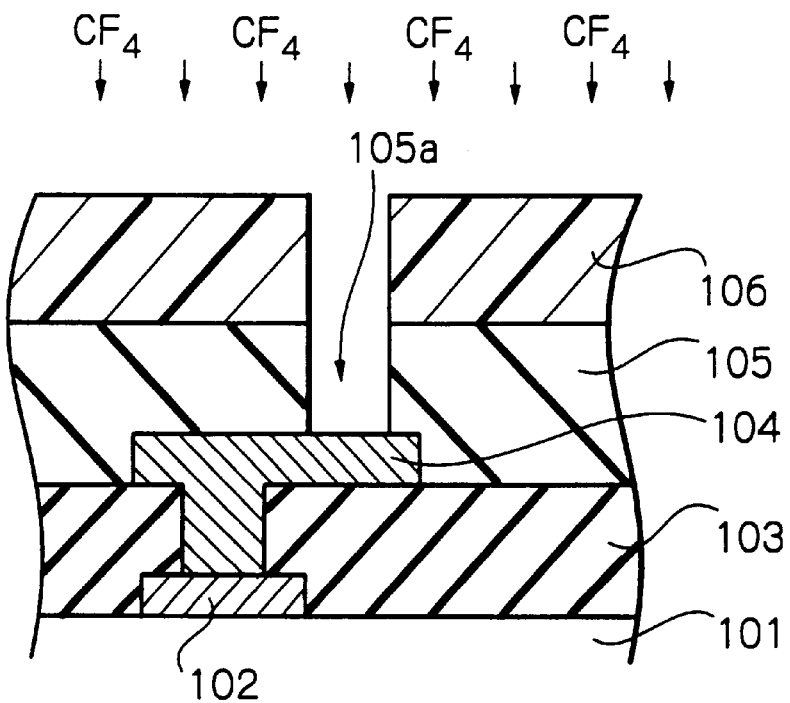

Finally, referring to FIG. 1D, the SiON layer 105 is anisotropically etched by a dry etching process using $CF_4$ gas, so that a contact hole 105a is perforated in the SiON layer 105.

In FIGS. 1A through 1D, the W layer 104 can be replaced by other refractory metal layers made of tungsten alloy, molybdenum (Mo) and molybdenum alloy, and the SiON layer 105 can be replaced by other insulating layers made of silicon oxide or silicon nitride.

Figure 2:
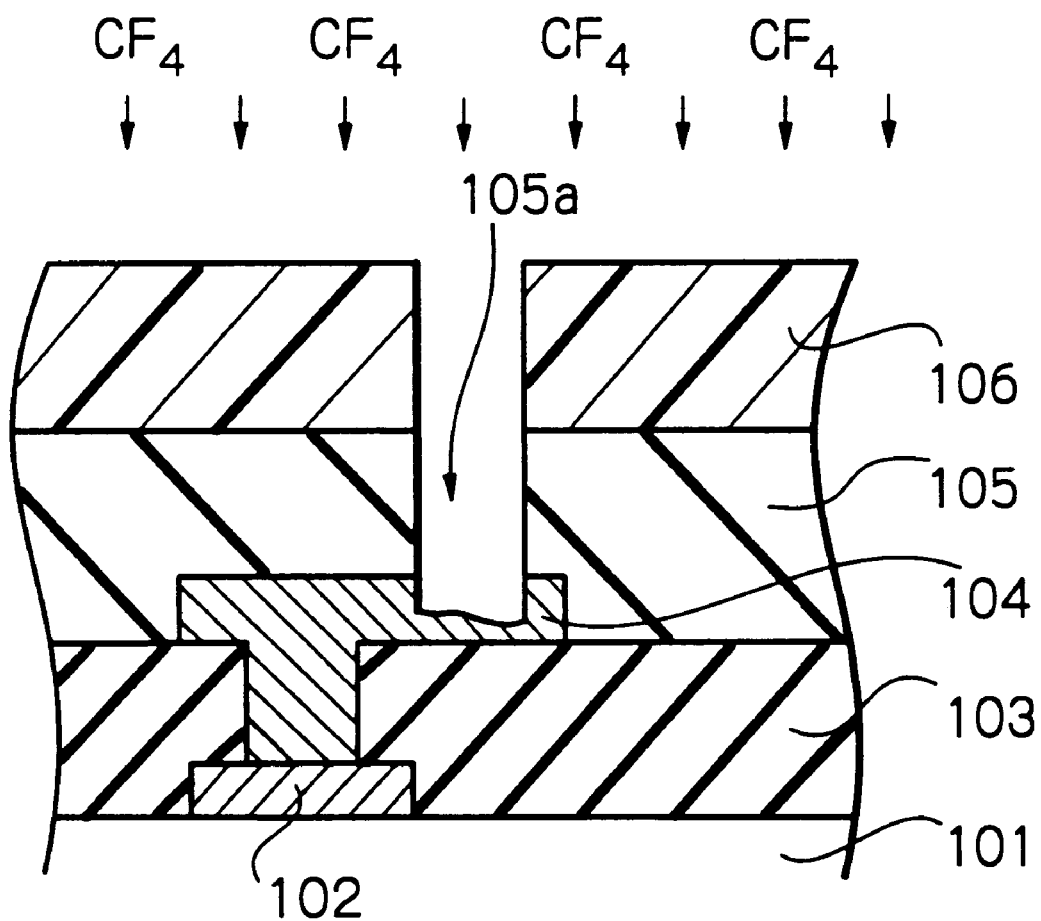
FIG. 2 is a cross-sectional view for explaining a problem caused in the first prior art method as illustrated in FIGS. 1A through 1D.
Figure 4:
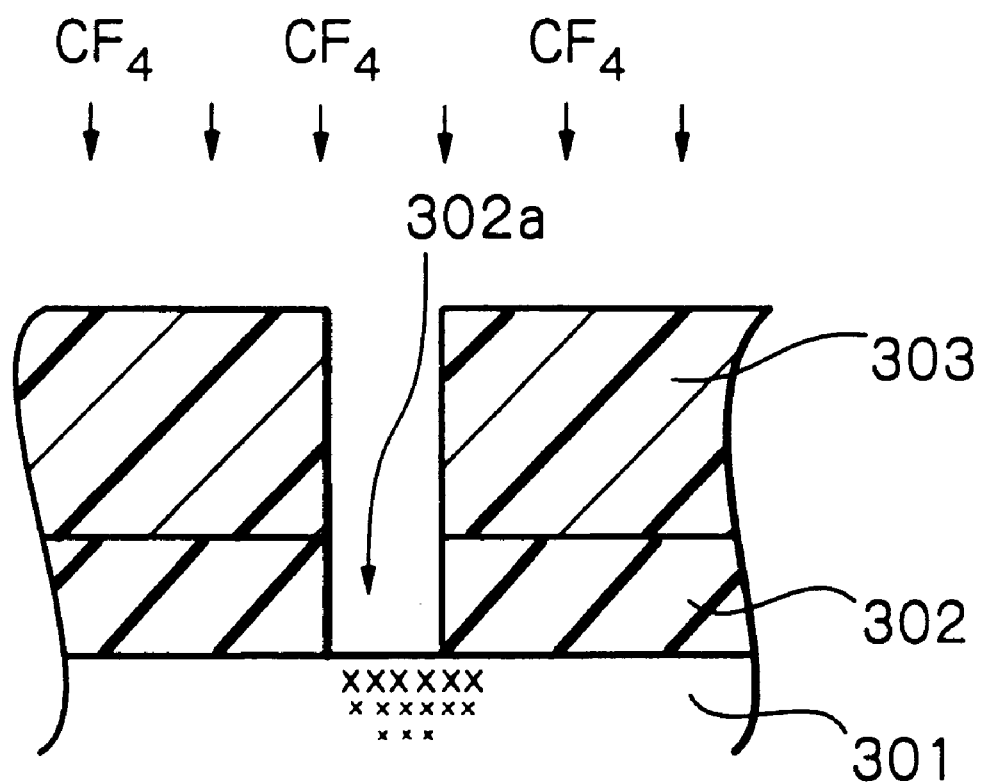
FIG. 4 is a cross-sectional view for explaining a problem caused in the second prior art method as illustrated in FIGS. 3A through 3C.

In the method as illustrated in FIGS. 1A through 1D, however, the etching rate ratio of the insulating layer 105 to the refractory metal layer 104 by the dry etching process using $CF_4$ gas is not sufficiently large, and therefore, as illustrated in FIG. 2, the refractory metal layer 104 is overetched. As a result, an electrode or a connection layer (not shown) deposited on the refractory metal layer 104 is easily separated therefrom, which increases contact resistance therebetween.

In addition, in the method as illustrated in FIGS. 1A through 1D, if the power of the dry etching process is increased to increase the above-mentioned etching ratio, the throughput is decreased.

FIGS. 3A through 3C are cross-sectional views illustrating a second prior art method for manufacturing device such as a field effect transistor (FET).

First, referring to FIG. 3A, an about 0.3 μm thick insulating layer 302 made of silicon oxide ($SiO_2$) is deposited on a semiconductor substrate 301 where active regions (not shown) are formed.

Next, referring to FIG. 3B, a photoresist pattern 303 having an opening 303a is coated on the insulating layer 302.

Finally, referring to FIG. 3C, the insulating layer 302 is anistropically etched by a dry etching process using $CF_4$ gas, so that a contact hole 302a is perforated in the insulating layer 302.

In the method as illustrated in FIGS. 3A through 3C, however, when the insulating layer 302 is overetched, the active regions of the semiconductor substrate 301 are exposed with $CF_3+$ ions which causes damage thereto. For example, the activation of dopants is reduced and the crystalline structure is changed.

In addition, if the power of the dry etching process is increased to reduce the damage of the active regions of the semiconductor substrate 301, the throughput is decreased.

Figure 5:
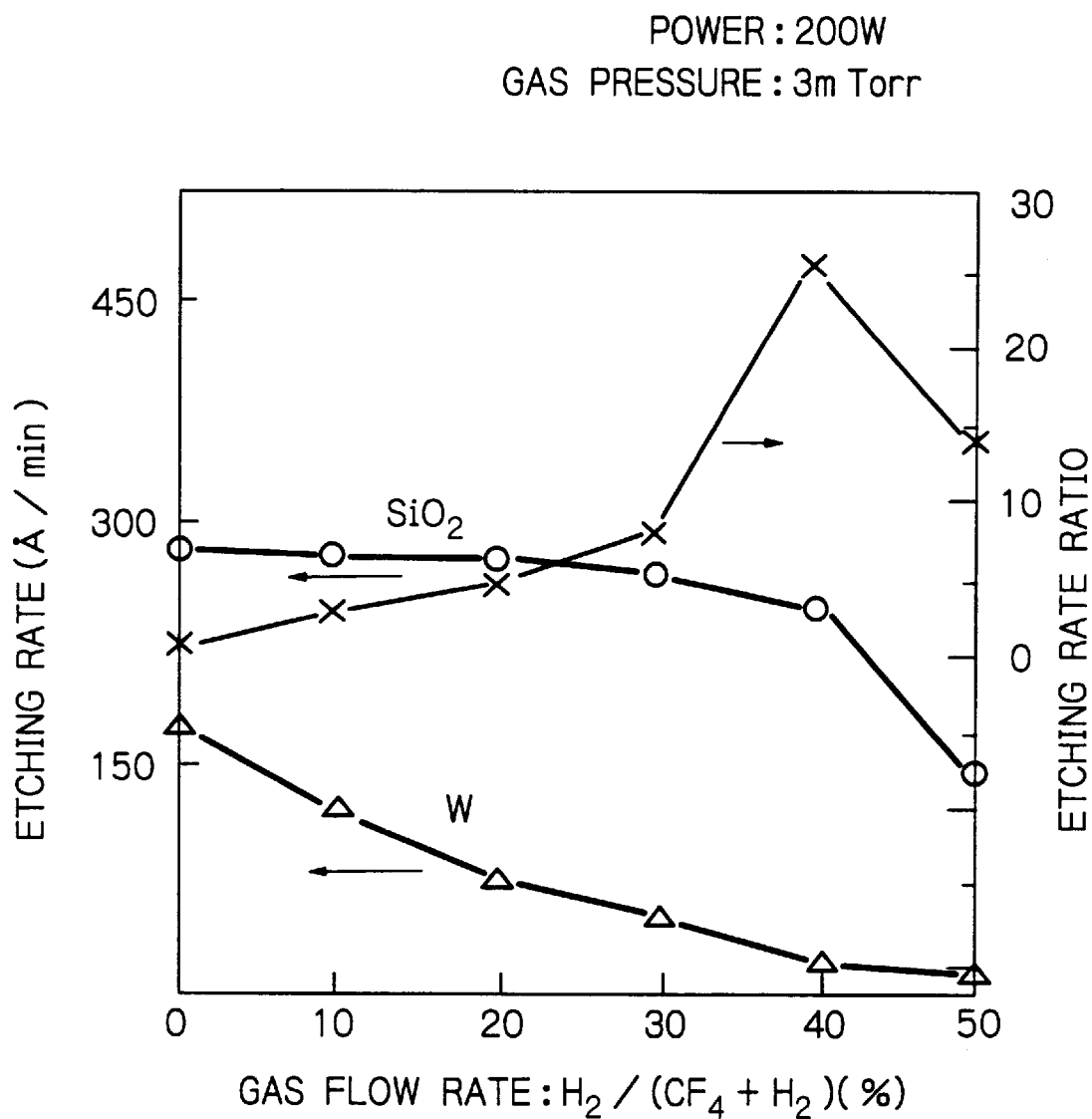
FIGS. 5, 6 and 7 are graphs showing etching rate characteristics according to the present invention.
Figure 6:
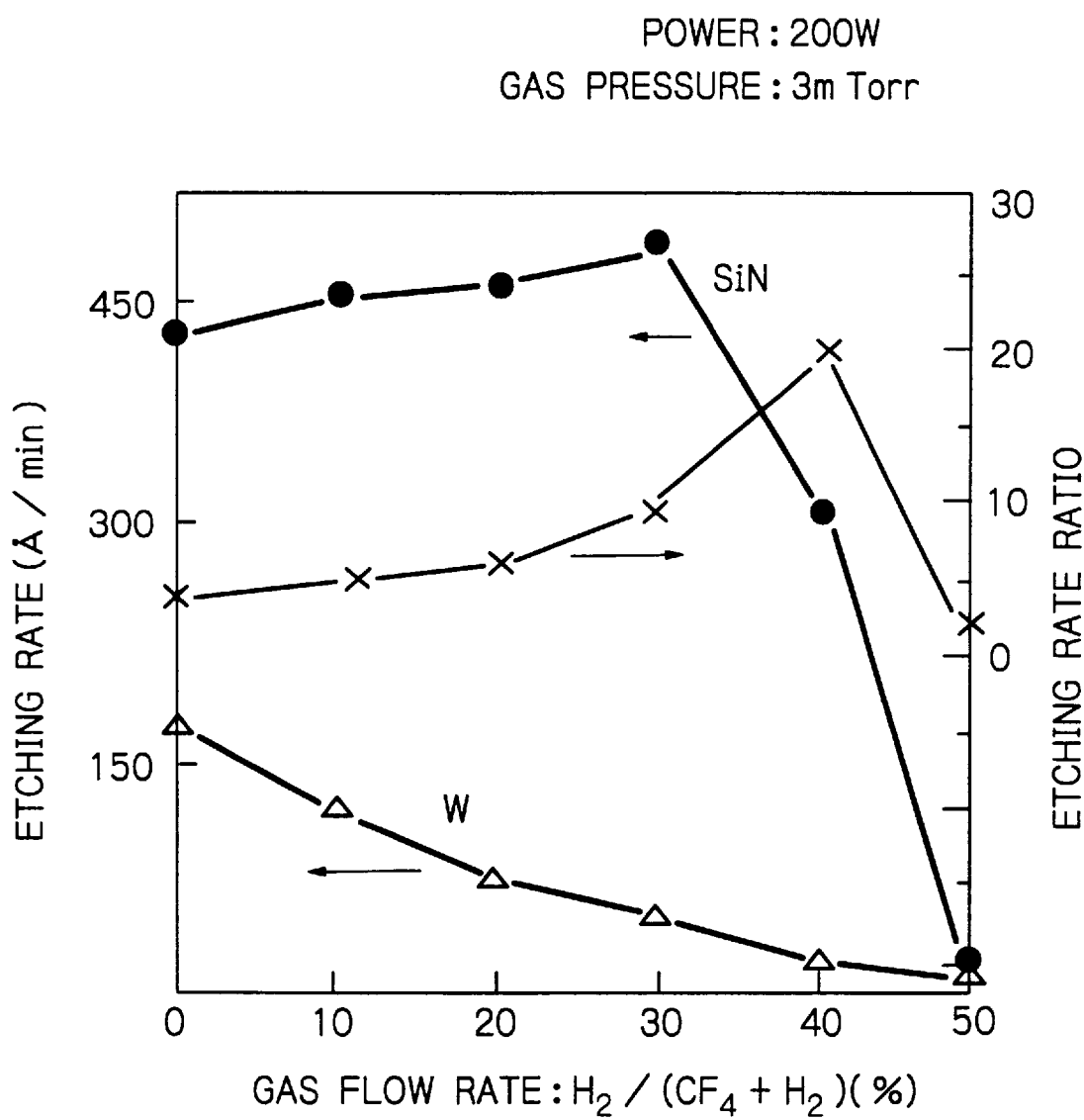

In FIGS. 5 and 6, which show principles of the present invention, a dry etching process using a mixture gas of $CF_4$ and $H_2$ exhibits a high etching rate ratio of an insulating layer made of silicon oxide ($SiO_2$) and silicon nitride (SiN) to a refractory metal layer made of W under the condition that the magnetron reactive ion etching (MRIE) power is 200 W and the gas pressure is 3 mTorr. If the refractory metal layer is made of Mo, a similar etching rate ratio is exhibited.

Note that, when fluorocarbon gas other than $CH_4$ gas is mixed with $H_2$ gas, a similar high etching rate ratio can be obtained. In addition, when hydrofluorocarbon gas such as $CHF_3$ is used instead of the mixture of $CH_4$ and $H_2$ or instead of $CH_4$ gas, a similar high etching rate ratio can be obtained.

Additionally, a similar high etching rate ratio can be obtained for other insulating layers made of silicon oxide nitride (SiON). Further, a similar high etching rate ratio can be obtained for other refractory metal layers made of tungsten alloy or molybdenum alloy.

Figure 7:
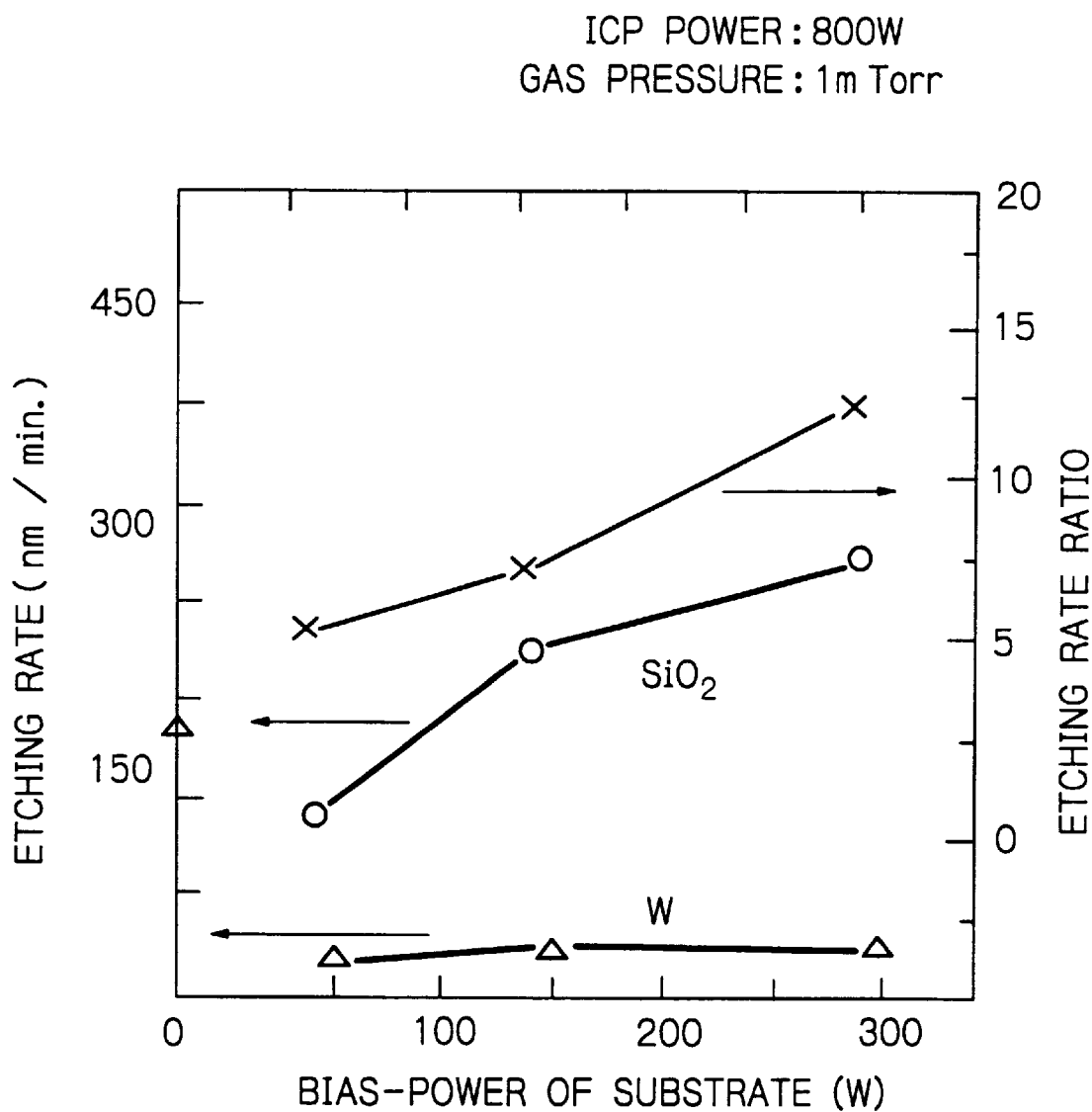

In FIG. 7, which also shows another principle of the present invention, an inductively coupled plasma (ICP) etching process using $C_3F_8$ exhibits a high etching rate ratio of an insulating layer made of silicon oxide ($SiO_2$) to a refractory metal layer made of W under the condition that the plasma power is 800 W and the gas pressure is 3 mTorr.

Note that, when fluorocarbon gas other than $CH_4$ gas is used instead of $CH_4$ gas, a similar high etching rate ratio can be obtained.

Additionally, a similar high etching rate ratio can be obtained for other insulating layers made of silicon nitride (SiN) and silicon oxide nitride (SiON). Further, a similar high etching rate ratio can be obtained for other refractor metal layers made of Mo, tungsten alloy or molybdenum alloy.

FIGS. 8A through 8F are cross-sectional views for explaining a first embodiment of the method for manufacturing a semiconductor device according to the present invention.

Figure 8A:
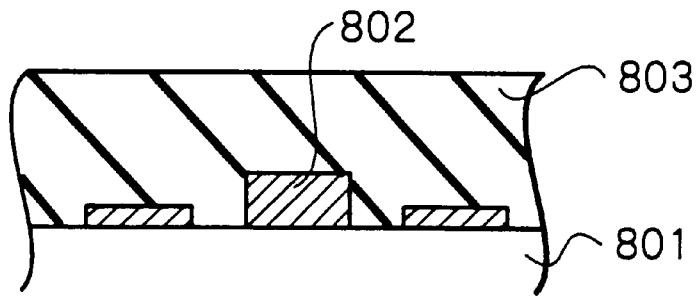
FIGS. 8A through 8F are cross-sectional views for explaining a first embodiment of the method for manufacturing a semiconductor device according to the present invention.

First, referring to FIG. 8A, an about 800 nm thick silicon oxide layer 803 is deposited on a semiconductor substrate 801 on which semiconductor elements 802 such as gate electrodes are already formed. Then, the silicon oxide layer 803 is etched back to flatten it. In this state, the silicon oxide layer 803 is 600 nm thick.

Figure 8B:
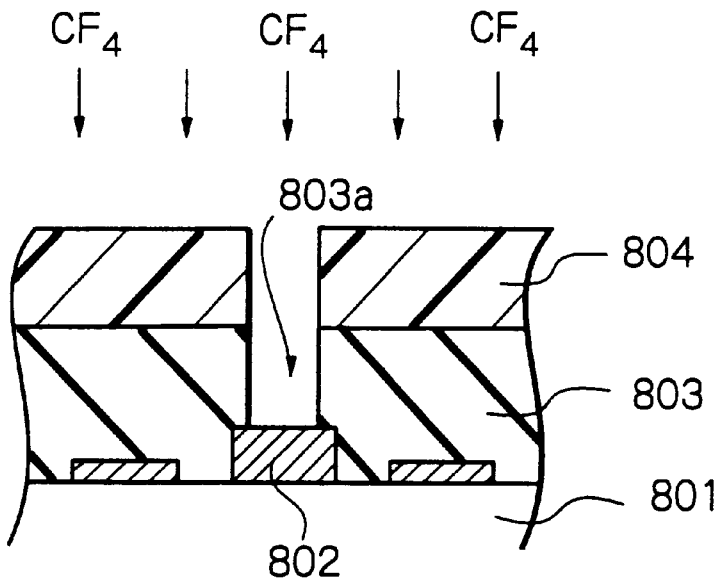

Next, referring to FIG. 8B, a photoresist pattern 804 having an opening 804a is coated on the silicon oxide layer 803. Then, a contact hole 803a is perforated in the silicon oxide layer 803 by a dry etching process using $CF_4$ gas. Then, the photoresist pattern 804 is removed.

Figure 8C:
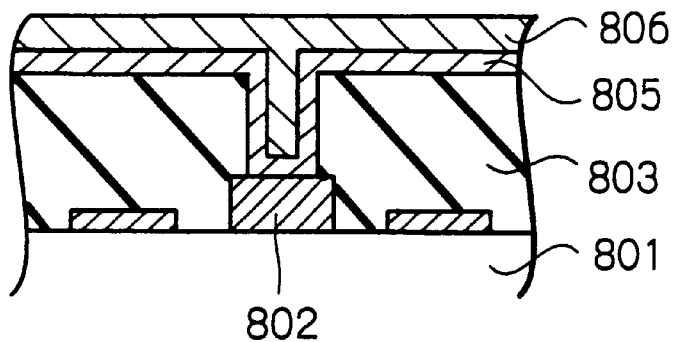

Next, referring to FIG. 8C, an about 50 nm thick titanium tungsten (TiW) layer 805 and an about 300 nm thick W layer 806 are sequentially deposited on the entire surface by a sputtering process. In this case, TiW layer 805 has good contact characteristics to the silicon oxide layer 803.

Figure 8D:
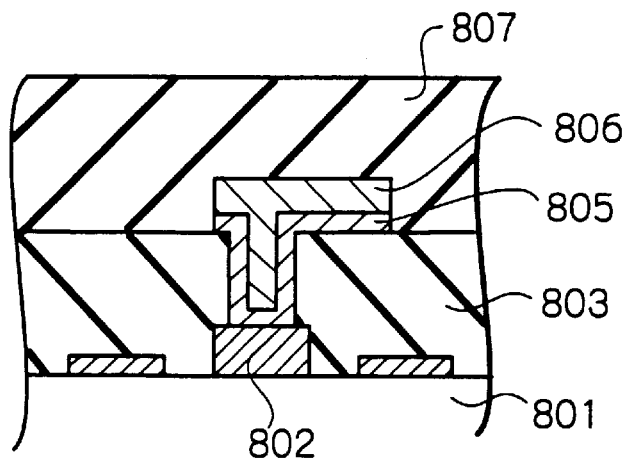

Next, referring to FIG. 8D, the W layer 806 and the TiW layer 805 are patterned by a photolithography and dry etching process using a mixture gas of $SF_6$ and $N_2$. Then, an about 900 nm thick silicon oxide layer 807 is deposited on the entire surface by a plasma CVD process, and then, is etched back to flatten it. In this state, the silicon oxide layer 807 is about 700 nm thick.

Figure 8E:
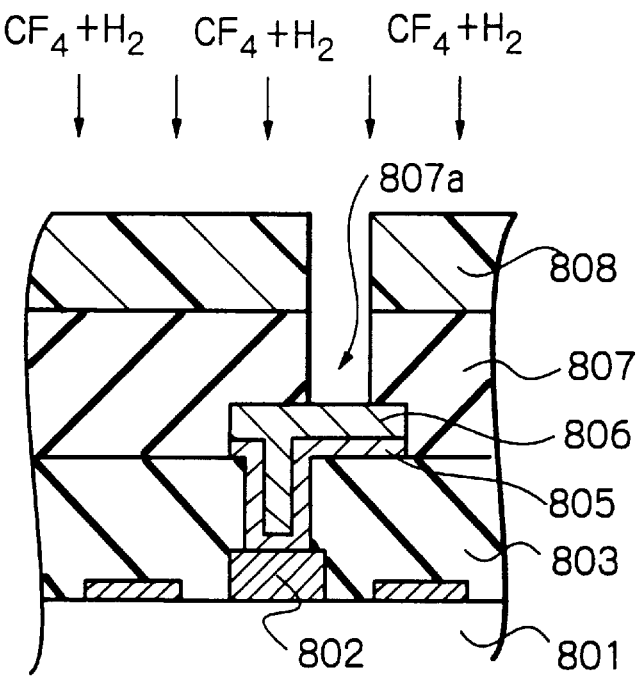
Figure 8F:
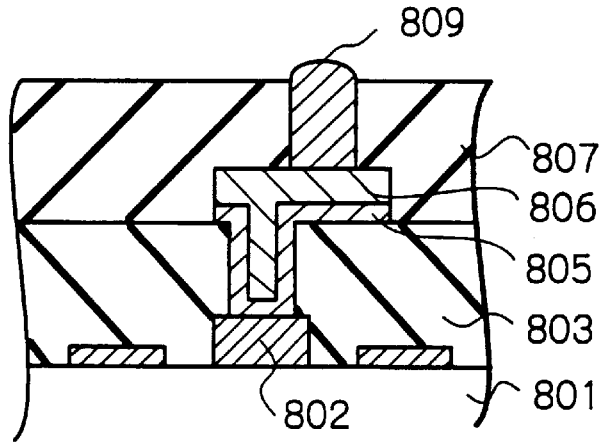

Next, referring to FIG. 8E, a photoresist pattern 808 having an opening is coated on the silicon oxide layer 807. Then, a contact hole 807a is perforated in the silicon oxide layer 807 by a dry etching process using a mixture gas of $CF_4$ and $H_2$ where the flow rate of $CF_4$ gas is 12 sccm, the flow rate of $H_2$ gas is 8 sccm, the plasma power is 200 W and the gas pressure is 3 mTorr. That is, a reactive ion etching process is carried out. In this case, the etching rate ratio of the silicon oxide layer 807 to the W layer 806 is larger than 15/1. Therefore, the W layer 806 is hardly etched. Then, the photoresist pattern 808 is removed.

Finally, referring to FIG. 8E, a W layer 809 is selectively grown by a CVD process, so that the W layer 809 is buried in the contact hole 807a and is in contact with the W layer 806.

In the method as illustrated in FIGS. 8A through 8F, since the W layer 806 is hardly etched, the W layer 809 is in good contact with the W layer 806, so that a contact resistance therebetween can be decreased. In addition, since the power can be increased without decreasing the etching rate ratio, the throughput can be enhanced.

FIGS. 9A through 9F are cross-sectional views for explaining a second embodiment of the method for manufacturing a semiconductor device according to the present invention.

Figure 9A:
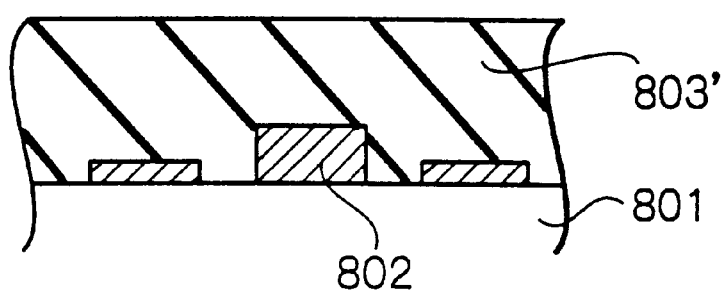
FIGS. 9A through 9F are cross-sectional views for explaining a second embodiment of the method for manufacturing a semiconductor device according to the present invention.

First, referring to FIG. 9A, an about 800 nm thick silicon nitride (SiN) layer 803' is deposited on a semiconductor substrate 801 on which a gate electrode 802' made of Mo is already formed. Then, the silicon nitride layer 803' is etched back to flatten it. In this state, the silicon nitride layer 803' is 600 nm thick.

Figure 9B:
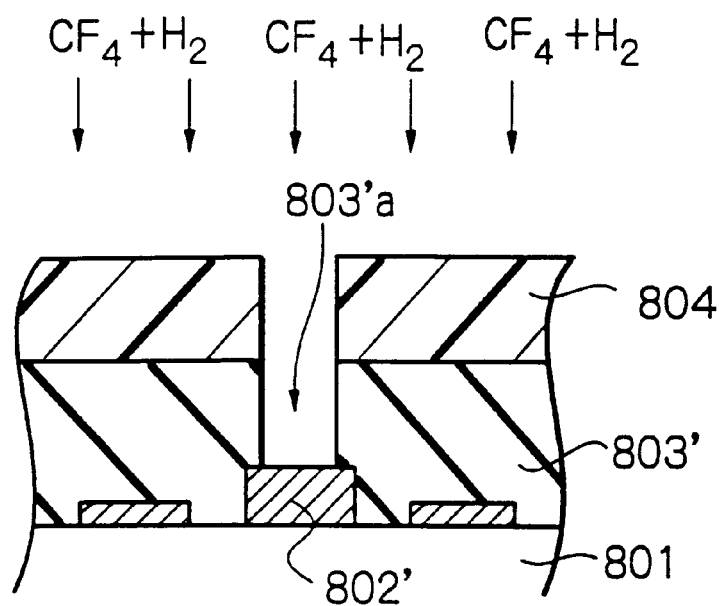

Next, referring to FIG. 9B, a photoresist pattern 804 having an opening 804a is coated on the silicon nitride layer 803'. Then, a contact hole 803'a is perforated in the silicon nitride layer 803' by a dry etching process using a mixture gas of $CF_4$ and $H_2$ where the flow rate of $CF_4$ gas is 14 sccm, the flow rate of $H_2$ gas is 6 sccm, the plasma power is 200 W and the gas pressure is 3 mTorr. That is, a reactive ion etching process is carried out. In this case, the etching rate ratio of the silicon nitride 803' to the Mo layer 802' is larger than 7/1. Therefore, the Mo layer 802' is hardly etched. Then, the photoresist pattern 804 is removed.

Figure 9C:
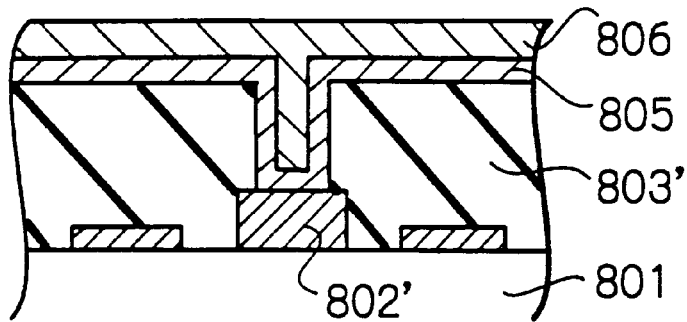

Next, referring to FIG. 9C, in the same way as in FIG. 8C, an about 50 nm thick TiW layer 805 and an about 300 nm thick W layer 806 are sequentially deposited on the entire surface by a sputtering process.

Figure 9D:
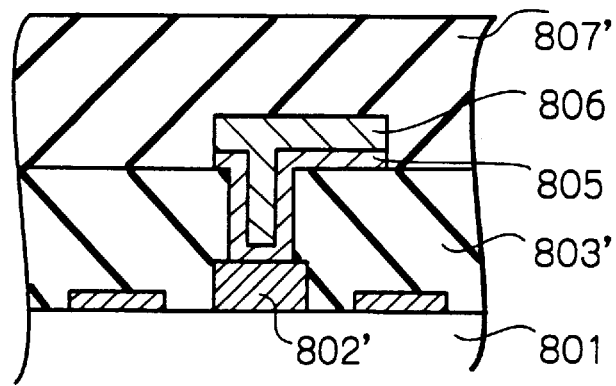

Next, referring to FIG. 9D, the W layer 806 and the TiW layer 805 are patterned by a photolithography and dry etching process using $SF_6$ gas. Then, an about 900 nm thick silicon nitride layer 807' is deposited on the entire surface by a plasma CVD process, and then, is etched back to flatten it. In this state, the silicon nitride layer 807' is about 700 nm thick.

Figure 9E:
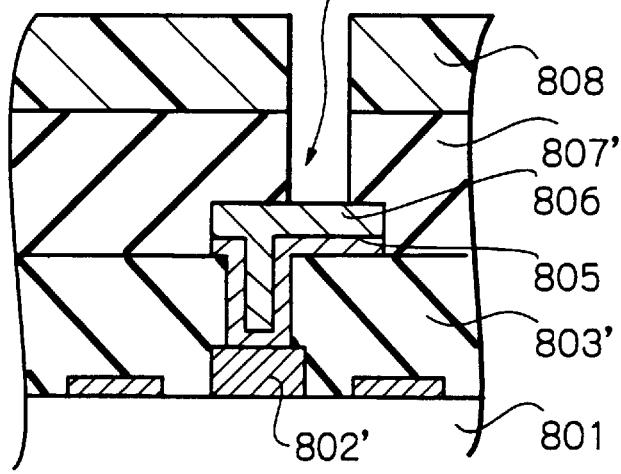

Next, referring to FIG. 9E, a photoresist pattern 808 having an opening is coated on the silicon nitride layer 807'. Then, a contact hole 807'a is perforated in the silicon nitride layer 807' by a dry etching process using a mixture gas of $CF_4$ and $H_2$ where the flow rate of $CF_4$ gas is 14 sccm, the flow rate of $H_2$ gas is 6 sccm, the plasma power is 200 W and the gas pressure is 3 mTorr. That is, a reactive ion etching process is carried out. In this case, the etching rate ratio of the silicon nitride layer 807' to the W layer 806 is larger than 10/1. Therefore, the W layer 806 is hardly etched. Then, the photoresist pattern 808 is removed.

Figure 9F:
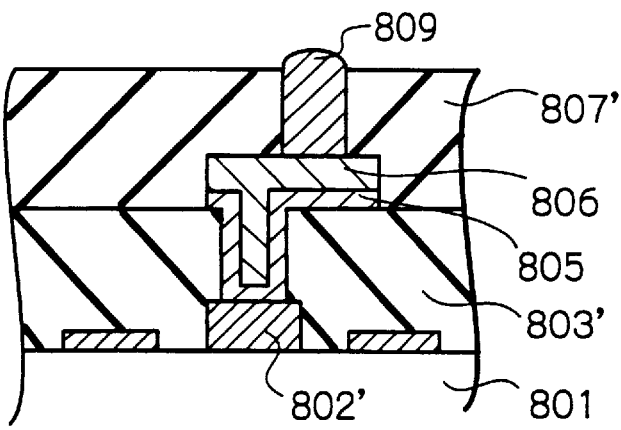

Finally, referring to FIG. 9F, a W layer 809 is selectively grown by a CVD process, so that the W layer 808 is buried in the contact hole 807'a and is in contact with the W layer 806.

In the method as illustrated in FIGS. 9A through 9F, since the W layer 806 is hardly etched, the W layer 809 is in good contact with the W layer 806, so that a contact resistance therebetween can be decreased. In addition, since the power can be increased without decreasing the etching rate ratio, the throughput can be enhanced.

FIGS. 10A through 10I are cross-sectional views for explaining a third embodiment of the method for manufacturing a semiconductor device according to the present invention. The third embodiment is applied to a high electron mobility transistor (HEMT).

Figure 10A:
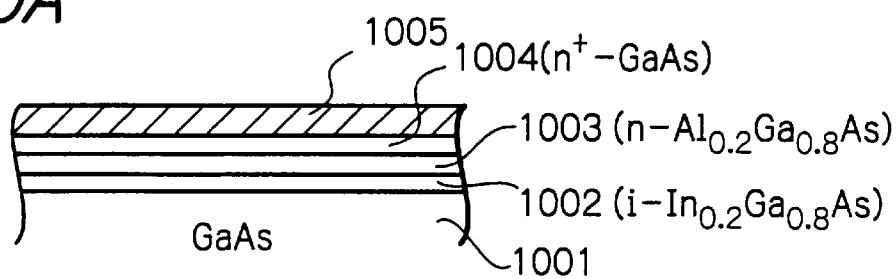

First, referring to FIG. 10A, grown on a semi-insulating GaAs substrate 1001 are an about 15 nm thick undoped $In_{0.2}Ga_{0.8}As$ channel layer 1002, an about 25 nm thick n-type $Al_{0.2}Ga_{0.8}As$ electron supply layer 1003 having an effective donor density of about $2\times10^{18}/cm^3$, and an about 30 nm thick n$^+$-type GaAs cap layer 1004 having an effective donor density of about $4\times10^{18}/cm^3$ by a molecular beam epitaxy (MBE) process or the like. Also, on the n$^+$-type GaAs cap layer 1004 an about 15 nm thick W layer 1005 is formed by a DC sputtering process.

Figure 10B:
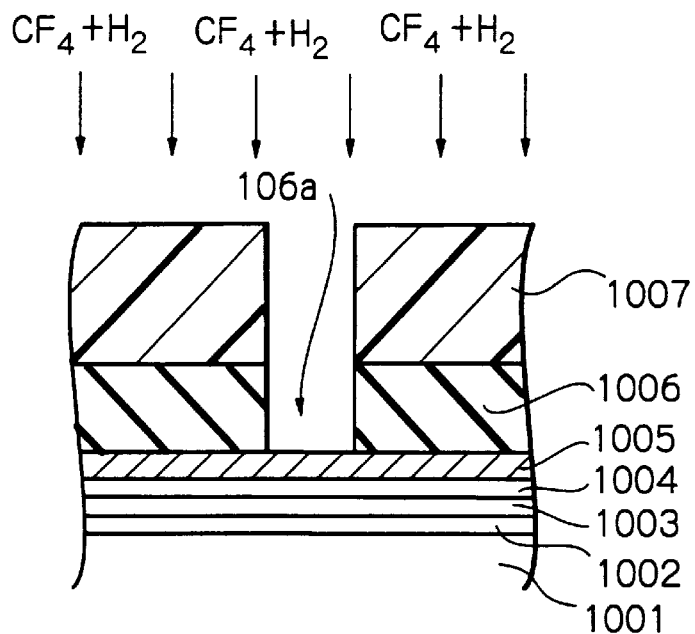

Next, referring to FIG. 10B, an about 300 nm thick silicon oxide layer 1006 is formed on the W layer 1005 by a thermal CVD process. Then, an about 1000 nm thick photoresist pattern 1007 having an opening is coated on the silicon oxide layer 1006. Then, a contact hole 1006a is perforated in the silicon oxide layer 1006 by a dry etching process using a mixture gas of $CF_4$ and $H_2$ where the flow rate of $CF_4$ gas 12 sccm, the flow rate of $H_2$ gas is 8 sccm, the plasma power is 200 W and the gas pressure is 3 mTorr. That is, a reactive ion etching process is carried out. In this case, the etching rate ratio of the silicon oxide layer 1006 to the W layer 1005 is larger than 15/1. Therefore, the W layer 1005 is hardly etched, so that the W layer 1005 serves as a damage preventing layer for the cap layer 1004 and the electron supply layer 1003, thus enhancing the activation of carriers by 15 percent. In addition, since the plasma power can be increased without reducing the etching rate ratio, the throughput can be enhanced. Then, the photoresist pattern 1007 is removed.

Figure 10C:
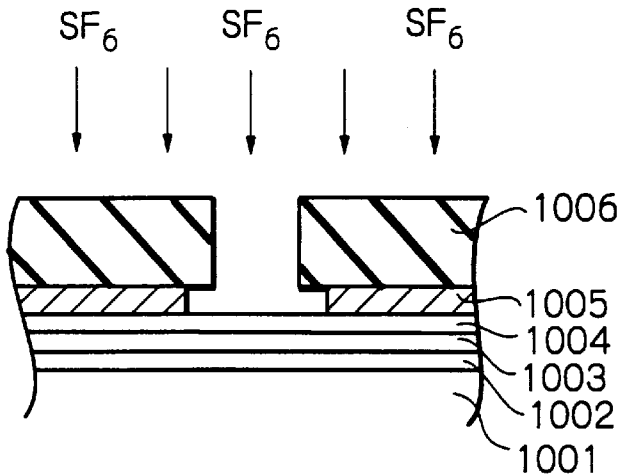
Figure 10D:
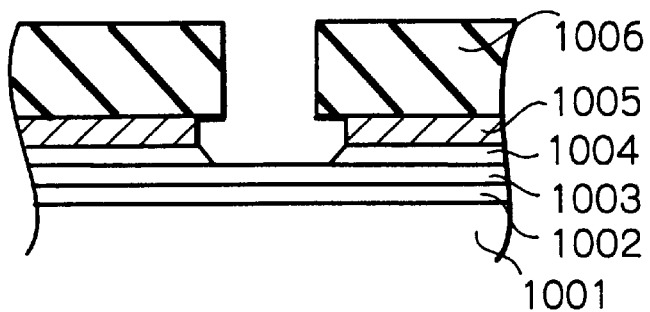

Next, referring to FIG. 10C, the W layer 1005 is etched by a dry etching process using $SF_6$ gas where the plasma power is 30 W and the gas pressure is 10 mTorr. Since the plasma power is so small, the cap layer 1004 and the electron supply layer 1003 are prevented from being damaged. Also, since the W layer 1005 is easily etched by free F radicals, the side portions thereof are etched. Further, the energy of etchant ions is not so large as to damage the crystalline characteristics of the cap layer 1004 and the electron supply layer 1005.

Next, referring to FIG. 1D, the cap layer 1004 is etched by using the silicon oxide layer 1006 and the W layer 1005 as a mask.

Figure 10E:
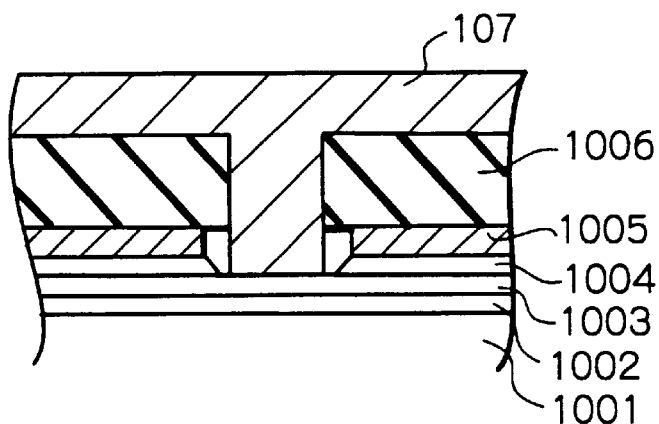

Next, referring to FIG. 10E, an about 30 nm thick tungsten silicide layer, an about 15 nm thick Ti layer, an about 30 nm thick platinum (pt) layer and an about 250 nm thick gold (Au) layer are deposited on the entire surface by a sputtering process to form a gate electrode layer 1007.

Figure 10F:
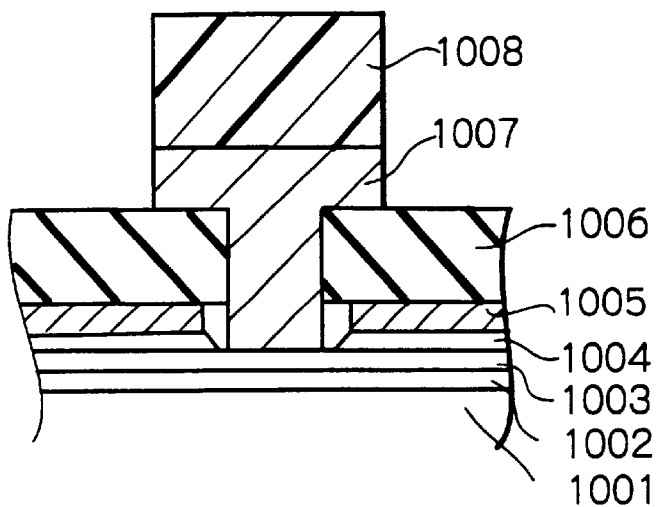

Next, referring to FIG. 10F, a photoresist pattern 1008 is coated on the gate electrode layer 1007. Then, the gate electrode layer 1007 is etched by an ion milling process using Ar. Then, the photoresist pattern 1008 is removed.

Next, referring to FIG. 10G, the silicon oxide layer 1006 is etched by a dry etching process using a mixture gas of $CF_4$ and $H_2$ where the flow rate of $CF_4$ gas is 12 sccm, the flow rate of $H_2$ gas is 8 sccm, the plasma power is 200 W and the gas pressure is 3 mTorr. That is, a reactive ion etching process using the gate electrode layer 1007 as a mask is carried out, so that the silicon oxide layer 1006 is patterned in self-alignment with the gate electrode layer 1007.

Next, referring to FIG. 10H, the W layer 1005 is further etched by a dry etching process using $SF_6$ gas where the plasma power is 30 W and the gas pressure is 10 mTorr.

Finally, referring to FIG. 10I, an about 100 nm thick AuGe layer, an about 35 nm thick Ni layer and an about 20 nm thick Au layer are deposited by an evaporating process to form ohmic metal layers 1008G, 1008S and 1008D. Then, a thermal treatment is performed thereupon at a temperature of about 450° C. for one minute to complete the HEMT.

FIGS. 11A through 11H are cross-sectional views for explaining a fourth embodiment of the method for manufacturing a semiconductor device according to the present invention. The fourth embodiment is also applied to a HEMT.

Figure 11A:
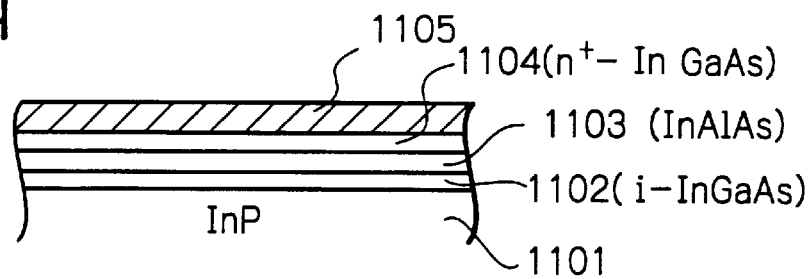
FIGS. 11A through 11H are cross-sectional views for explaining a fourth embodiment of the method for manufacturing a semiconductor device according to the present invention.

First, referring to FIG. 11A, grown on a semi-insulating InP substrate 1101 are an about 15 nm thick undoped InGaAs channel layer 1102, an about 20 nm thick n-type InAlAs electron supply layer 1103 having an effective donor density of about $2 \times 10^{18}/cm^3$, and an about 30 nm thick n$^+$-type InGaAs cap layer 1104 having an effective donor density of about $5 \times 10^{18}/cm^3$ by a MBE process or the like. Also, on the n$^+$-type InGaAs cap layer 1104 an about 20 nm thick Mo layer 1105 is formed by an E gun sputtering process.

Figure 11B:
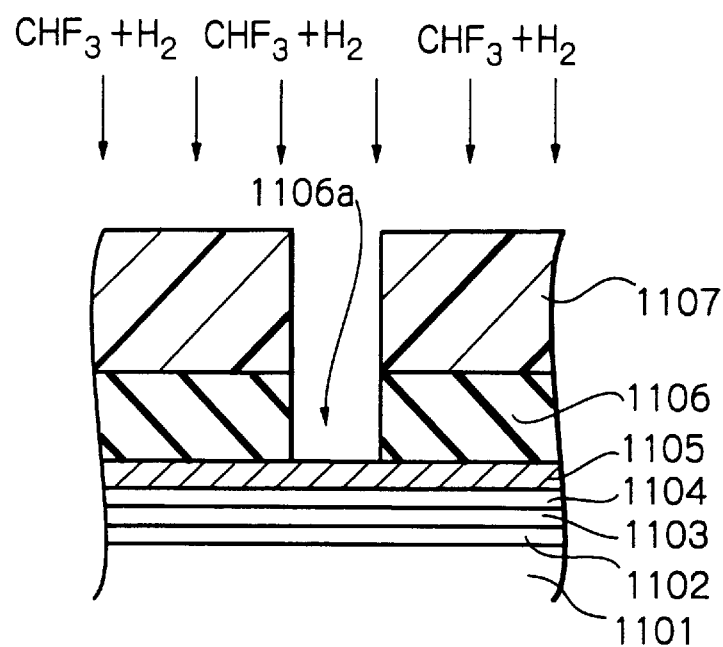

Next, referring to FIG. 11B, an about 250 nm thick silicon nitride (SiN) layer 1106 is formed on the Mo layer 1105 by a thermal CVD process. Then, an about 1000 nm thick photoresist pattern 1107 having an opening is coated on the silicon nitride layer 1106. Then, a contact hole 1106a is perforated in the silicon nitride layer 1106 by a dry etching process using a mixture gas of CHF$_3$ and H$_2$ where the flow rate of CHF$_3$ gas 17 sccm, the flow rate of H$_2$ gas is 3 sccm, the plasma power is 150 W and the gas pressure is 3 mTorr. That is, a reactive ion etching process is carried out. In this case, the etching rate ratio of the silicon nitride layer 1106 to the Mo layer 1105 is larger than 7/1. Therefore, the Mo layer 1105 is hardly etched, so that the Mo layer 1105 serves as a damage preventing layer for the cap layer 1104 and the electron supply layer 1103, thus enhancing the activation of carriers. In addition, since the plasma power can be increased without reducing the etching rate ratio, the throughput can be enhanced. Then, the photoresist pattern 1007 is removed.

Figure 11C:
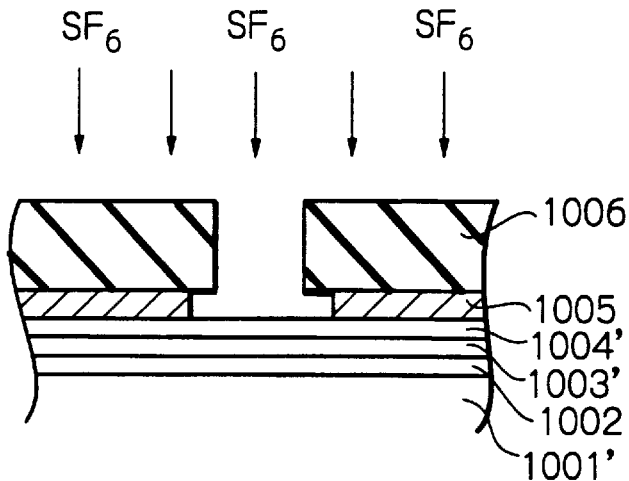
Figure 11D:
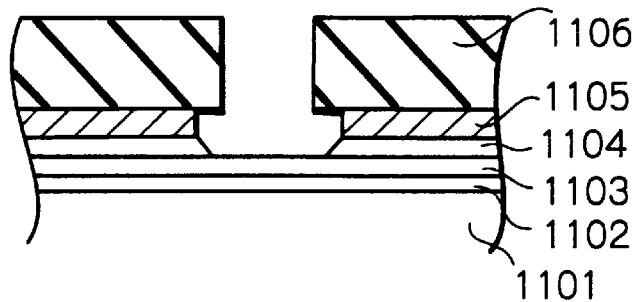

Next, referring to FIG. 11C, the Mo layer 1105 is etched by a dry etching process using SF$_6$ gas where the plasma power is 30 W and the gas pressure is 10 mTorr. Since the plasma power is so small, the cap layer 1104 and the electron supply layer 1103 are prevented from being damaged. Also, since the Mo layer 1105 is easily etched by free F radicals, the side portions thereof are etched. Further, the energy of etchant ions is not so large as to damage the crystalline characteristics of the cap layer 1104 and the electron supply layer 1103.

Next, referring to FIG. 1D, the cap layer 1104 is etched using the silicon nitride layer 1106 and the Mo layer 1105 as a mask.

Figure 11E:
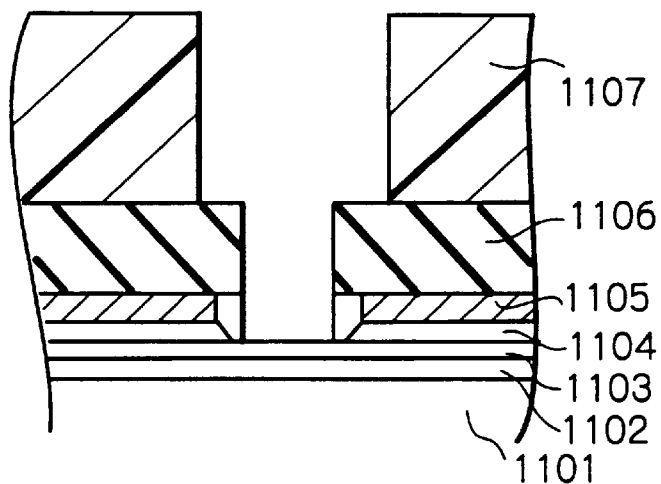

Next, referring to FIG. 11E, a photoresist pattern 1107 is coated on the silicon nitride layer 1106.

Figure 11F:
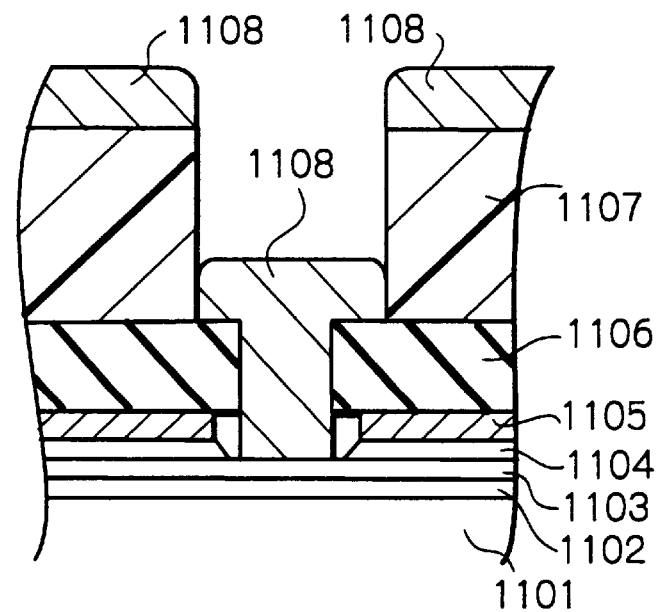

Next, referring to FIG. 11F, an about 35 nm thick Mo layer, an about 15 nm thick Ti layer, an about 30 nm thick pt layer and an about 250 nm thick Au layer are deposited on the entire surface by an Electron-beam gun evaporation process to form a gate electrode layer 1108.

Figure 11G:
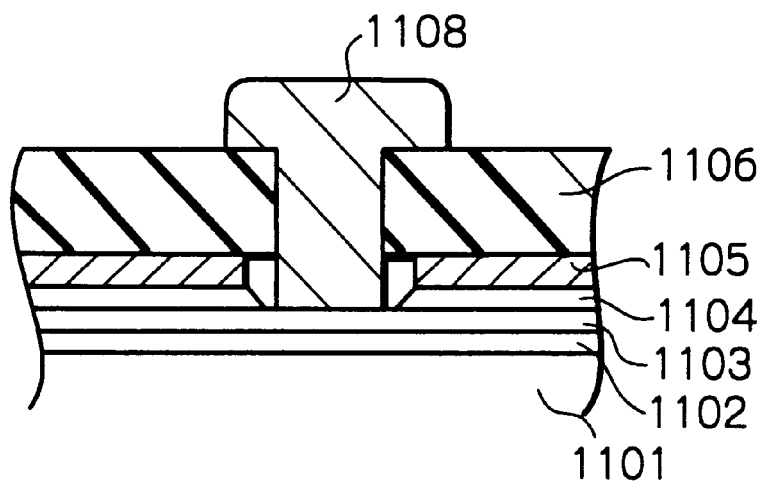

Next, referring to FIG. 11G, the photoresist pattern 1107 is removed, so that the gate electrode layer 1108 on the photoresist pattern 1108 is lifted off.

Figure 11H:
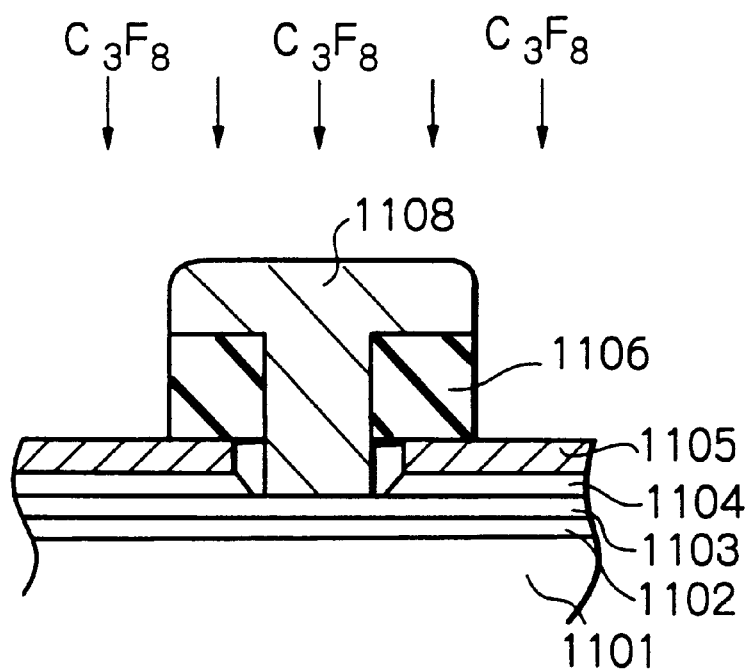

Finally, referring to FIGS. 11H, the silicon nitride layer 1106 is etched by a dry etching process using C$_3$F$_8$ gas where the plasma power is 150 W and the gas pressure is 3 mTorr. That is, an inductively coupled plasma etching process is carried out. In this case, the etching rate ratio of the silicon nitride layer to the Mo layer is larger than 10/1. As a result, the silicon nitride layer 1106 is patterned in self-alignment with the gate electrode layer 1108. Then, a thermal treatment is performed thereupon, to complete the HEMT. Note that the Mo layer 1105 serves as an ohmic metal layer.

FIGS. 12A through 12I are cross-sectional views for explaining a fifth embodiment of the method for manufacturing a semiconductor device according to the present invention. The fifth embodiment is also applied to a HEMT.

Figure 12A:
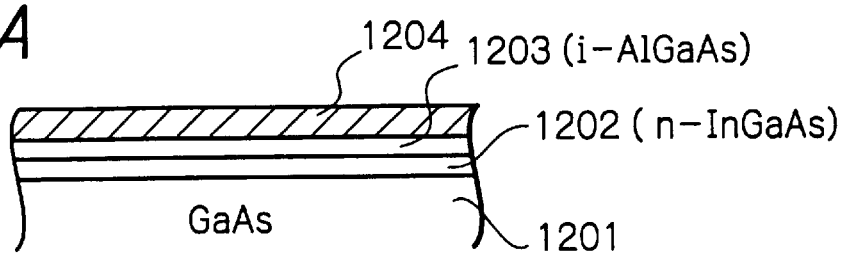
FIGS. 12A through 12G are cross-sectional views for explaining a fifth embodiment of the method for manufacturing a semiconductor device according to the present invention.

First, referring to FIG. 12A, grown on a semi-insulating GaAs substrate 1201 are an about 25 nm thick n-type InGaAs channel layer 1202, having an effective donor density of about $2 \times 10^{18}/cm^3$ and an about 15 nm thick undoped AlGaAs barrier layer 1203 by a MBE process or the like. Also, on the i$^+$-type AlGaAs barrier layer 1203 an about 15 nm thick W layer 1204 is formed by a DC sputtering process.

Figure 12B:
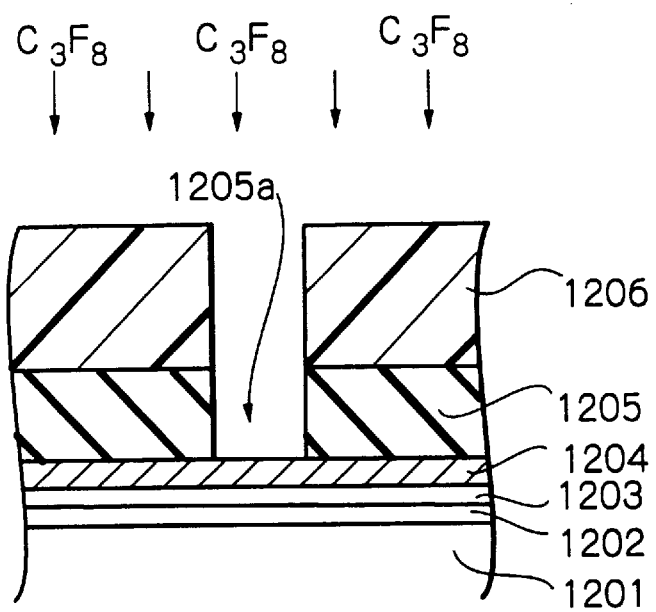

Next, referring to FIG. 12B, an about 300 nm thick silicon oxide layer 1205 is formed on the WSi layer 1204 by a thermal CVD process. Then, an about 1000 nm thick photoresist pattern 1206 having an opening is coated on the silicon oxide layer 1205. Then, a contact hole 1205a is perforated in the silicon oxide layer 1205 by a dry etching process using C$_3$F$_8$ gas where the inductively coupled plasma power is 800 W, the plasma power is 50 W and the gas pressure is 1 mTorr. In this case, the etching rate ratio of the silicon oxide layer 1205 to the W layer 1204 is larger than 6.5/1. Therefore, the W layer 1204 is hardly etched, so that the W layer 1204 serves as a damage preventing layer for the barrier layer 1203 and the channel layer 1202, thus enhancing the activation of carriers. In addition, since the plasma power can be increased without reducing the etching rate ratio, the throughput can be enhanced. Then, the photoresist pattern 1206 is removed.

Figure 12C:
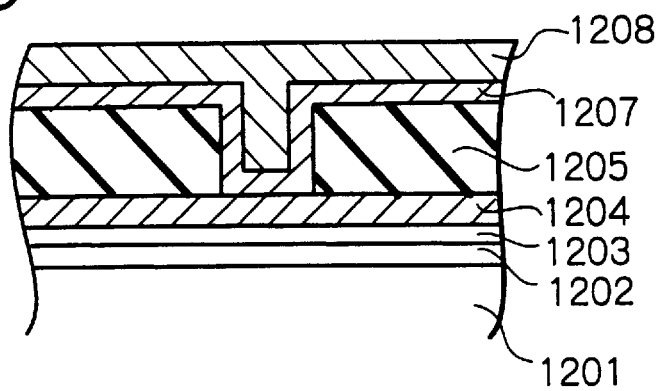
Figure 12D:
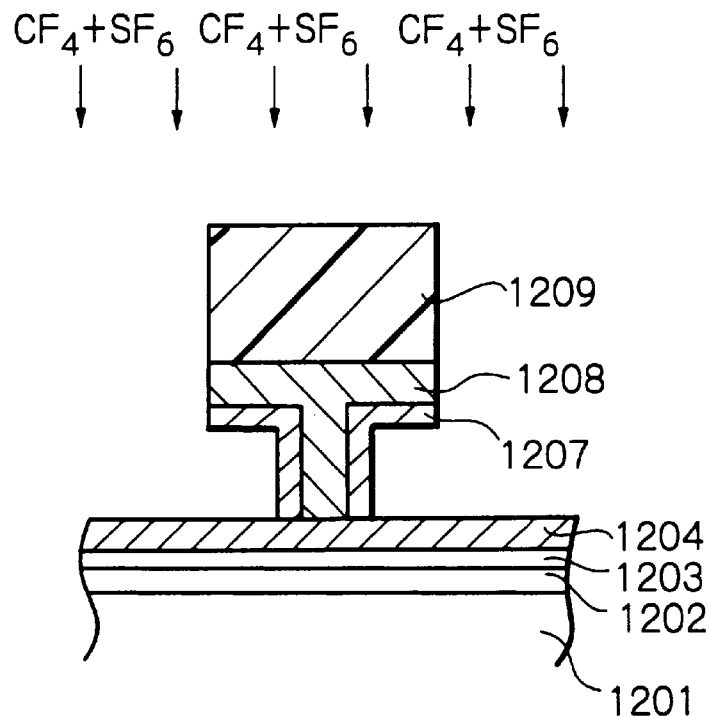

Next, referring to FIG. 12C, an about 50 nm thick TiW layer 1207 and an about 250 nm thick W layer 1208 are sequentially deposited on the entire surface by a sputtering process Next, referring to FIG. 12D, a photoresist pattern 1209 is coated on the W layer 1208. Then, the W layer 1205, 1208 and the TiW layer 1207 are etched by a dry etching process using a mixture gus of CF$_4$ and SF$_6$ where the plasma power is 30 W and the gas pressure is 10 mTorr. Then, the silicon oxide layer 1205 is etched by using buffered fluoric acid. Then, the photoresist pattern 1209 is removed.

Figure 12E:
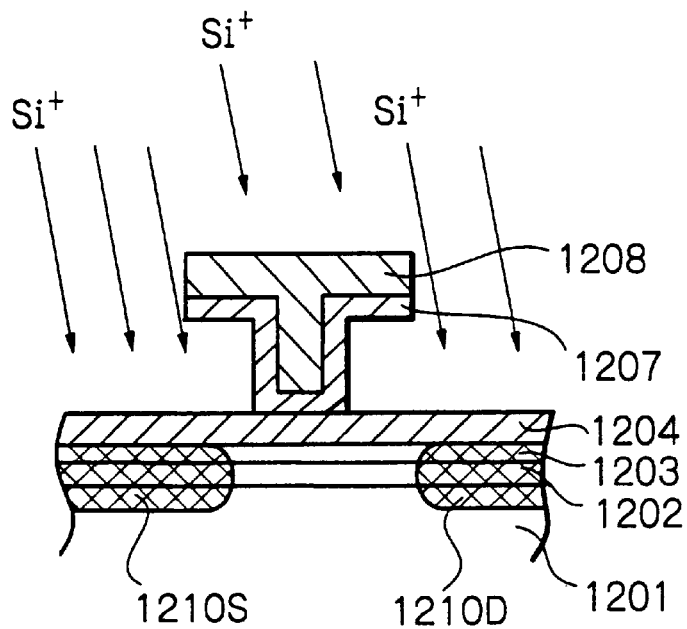

Next, referring to FIG. 12E, $4 \times 10^{18}$ silicon ions/cm$^2$ are implanted obliquely at an energy of 100 keV. Then, an annealing operation is carried out to activate implanted silicon atoms. As a result, n$^+$-type ohmic cap regions 1210S and 1210D are formed.

Figure 12F:
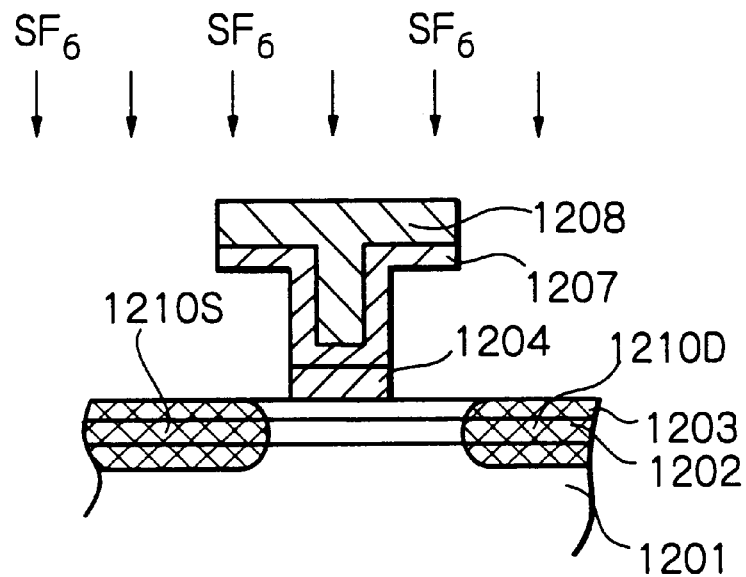

Next, referring to FIG. 12F, the W layer 1204 is etched by a dry etching process using SF$_6$ gas where the plasma power is 30 W and the gas pressure is 10 mTorr. Since the plasma power is so small, the barrier layer 1203 and the channel layer 1202 are prevented from being damaged. Also, since the W layer 1204 is easily etched by neutral P radicals, the side portions thereof are etched. Further, the energy of etchant ions is not so large as to damage the crystalline characteristics of the barrier layer 1203 and the electron channel layer 1202.

Figure 12G:
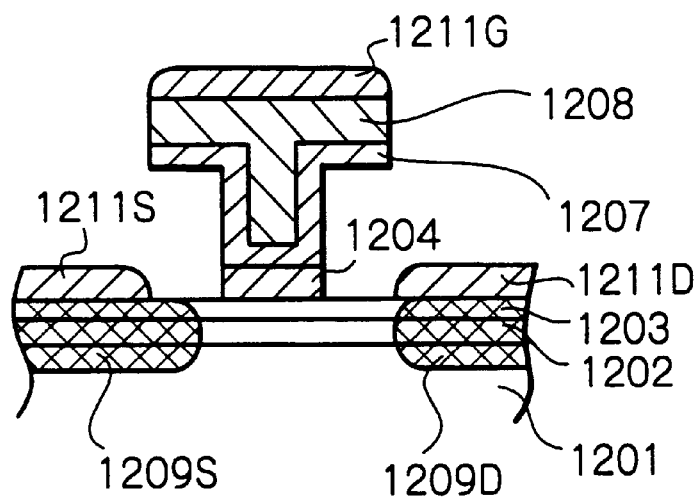

Finally, referring to FIG. 12G, an about 100 nm thick AuGe layer, an about 35 nm thick Ni layer and an about 20 nm thick Au layer are deposited by an evaporating process to form ohmic metal layers 1211G, 1211S and 1211D. Then, a thermal treatment is performed thereupon at a temperature of about 450° C. for one minute, to complete the HEMT.

As explained hereinabove, according to the present invention, since the etching rate ratio of an insulating layer to a refractory metal layer is increased, the overetching of the refractory metal layer during a contact hole forming step can be avoided, so that an electrode or a connection layer deposited on the refractory metal layer is hardly separated therefrom. As a result, the increase of a contact resistance between the refractory metal layer and the electrode or connection layer can be suppressed. In addition, since the power of a dry etching process apparatus can be increased without decreasing the etching rate ratio, the throughput can be enhaced. Further, since the overetching of active regions of a semiconductor substrate is suppressed, the damage of the active regions can be avoided, so that the activation of dopants is not reduced and the crystalline structure is not fluctuated.

I claim:

1. A method for manufacturing a semiconductor device comprising the steps in sequence of:

forming a refractory metal layer;

forming an insulating layer on said refractory metal layer; and perforating a contact hole in said insulating layer by a dry etching process using an etching gas, said etching gas is a mixture gas of fluorocarbon and hydrogen comprising a flow rate ratio of hydrogen to fluorocarbon plus hydrogen in the mixture gas of about 10 to 50 percent.

2. The method as set forth in claim 1, wherein said refractory metal layer is made of one of tungsten, tungsten alloy, molybdenum and molybdenum alloy.

3. The method as set forth in claim 1, wherein said insulating layer is made of one of silicon oxide, silicon nitride and silicon oxide nitride.

4. A method for manufacturing a semiconductor device comprising the steps in sequence of:

forming a metal layer on a semiconductor substrate;

forming a first insulating layer on said semiconductor substrate and said metal layer;

perforating a gate opening in said first insulating layer, so that said metal layer is exposed;

forming a first refractory metal layer on said first insulating layer and said metal layer after said gate opening hole is perforated;

forming a second insulating layer on said first refractory metal layer;

perforating a contact hole in said second insulating layer by a dry etching process using an etching gas, so that said first refractory metal layer is exposed; and burying a second refractory metal layer in said contact hole, said etching gas is a mixture gas of fluorocarbon and hydrogen flow rate ratio of hydrogen to fluorocarbon plus hydrogen in the mixture gas of about 10 to 50 percent.

5. The method as set forth in claim 4, wherein said first refractory metal layer is made of titanium tungsten and tungsten, said second refractory metal layer being made of tungsten, said second insulating layer being made of silicon oxide.

* * * * *